(12) United States Patent
Becker et al.

(10) Patent No.: US 6,653,953 B2
(45) Date of Patent: Nov. 25, 2003

(54) VARIABLE LENGTH CODING PACKING ARCHITECTURE

(75) Inventors: Ricardo A. Becker, Phoenix, AZ (US); Tinku Acharya, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/935,524

(22) Filed: Aug. 22, 2001

(65) Prior Publication Data

US 2003/0038736 A1 Feb. 27, 2003

(51) Int. Cl.[7] .................................................. H03M 7/00
(52) U.S. Cl. ........................................ 341/60; 370/537
(58) Field of Search ............................. 341/60, 67, 50; 370/537, 538

(56) References Cited

U.S. PATENT DOCUMENTS

| | | | | |
|---|---|---|---|---|
| 5,119,092 A | * | 6/1992 | Sumi et al. ................... 341/60 |
| 5,321,398 A | | 6/1994 | Ikeda ........................... 341/67 |
| 5,379,116 A | * | 1/1995 | Wada et al. ............ 358/426.12 |
| 5,499,382 A | | 3/1996 | Nusinov et al. ............. 395/800 |
| 6,014,095 A | * | 1/2000 | Yokoyama ..................... 341/67 |
| 6,065,066 A | | 5/2000 | Tan ................................. 710/4 |
| 6,125,406 A | * | 9/2000 | Williams et al. ................ 710/5 |
| 6,195,026 B1 | * | 2/2001 | Acharya ....................... 341/60 |
| 6,356,212 B1 | * | 3/2002 | Lyons et al. .................. 341/60 |
| 6,463,082 B2 | * | 10/2002 | Bergenwall et al. ........ 370/535 |

FOREIGN PATENT DOCUMENTS

| | | | | |
|---|---|---|---|---|
| FR | 0017499 | * | 12/1986 | ............. H04J/3/16 |
| JP | 403262332 | * | 11/1991 | ............. H03M/7/40 |
| JP | 09171038 | * | 6/1997 | ............. H04N/7/08 |
| JP | 411004421 | * | 6/1999 | ............. H04N/7/08 |

* cited by examiner

Primary Examiner—Peguy JeanPierre
(74) Attorney, Agent, or Firm—Blakely, Sokoloff, Taylor & Zafman LLP

(57) ABSTRACT

Embodiments of a variable length coding packing architecture are discussed. In this regard, an example method of packing selected portions of separate bit strings into a buffer is presented. The example method comprises using multiplexers (MUXes) to select the desired portions of the separate bit strings to be packed in the buffer, and using MUXes to order the bits of the selected portions for packing in particular buffer locations.

19 Claims, 9 Drawing Sheets

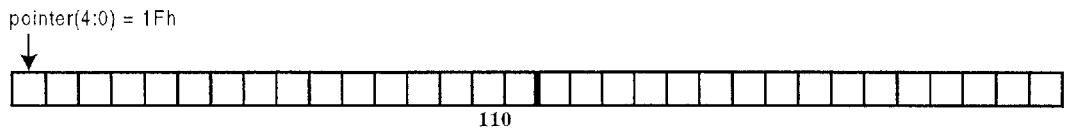
Fig. 1 example bit-packing buffer
Fig. 2 example bit-packing buffer after packing code '100'
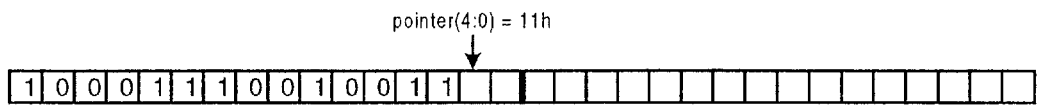
Fig. 3 example bit-packing buffer after additional bit packing
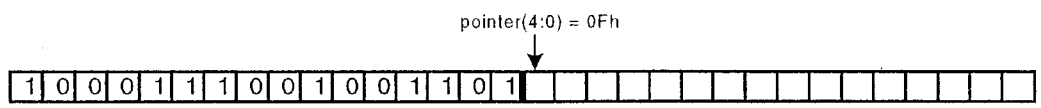
Fig. 4 example bit-packing buffer after additional bit packing
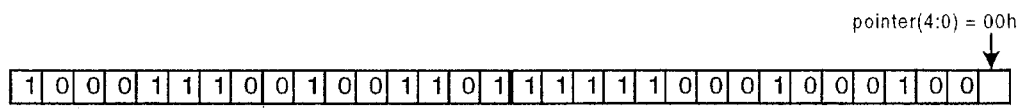
Fig. 5 example bit-packing buffer after additional bit packing
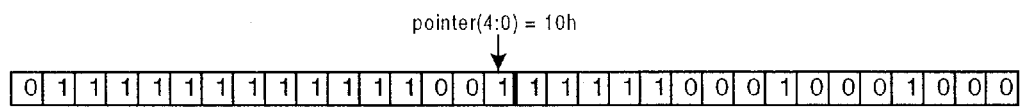
Fig. 6 example bit-packing buffer after additional bit packing

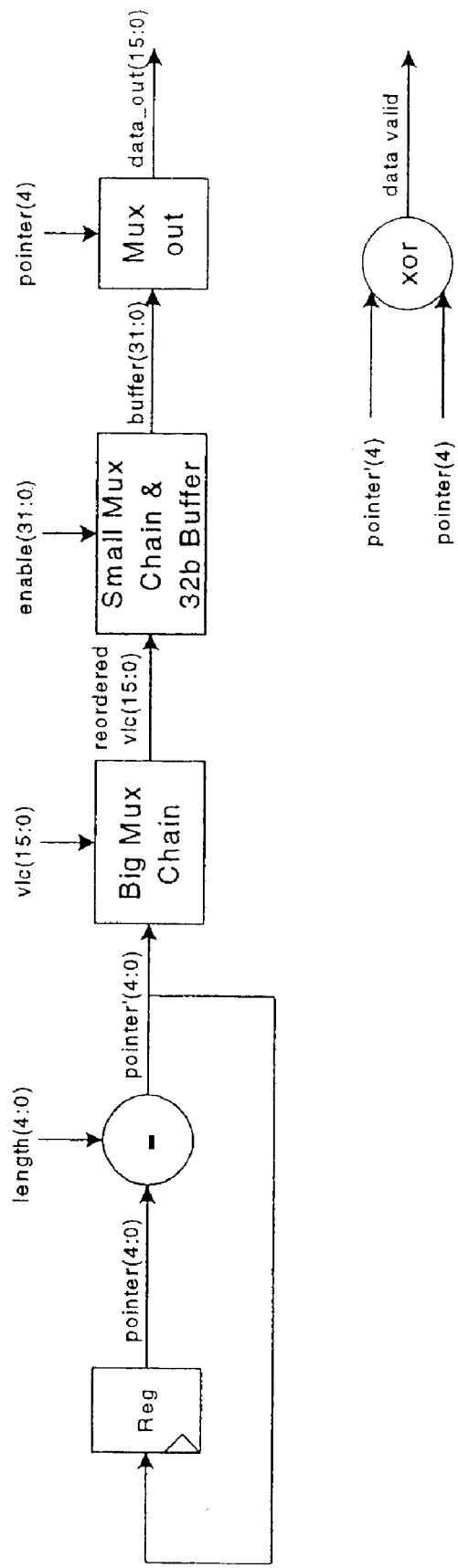
Fig. 7 block diagram of an embodiment of a bit packer

Fig. 11: buffer contents

Fig. 12

| sel=1 | 13 | 12 | 11 | 10 | 9 | 8 | 7 | 6 | 5 | 4 | 3 | 2 | 1 | 0 | 15 | 14 |

Fig. 13

Fig. 14 buffer contents

Fig. 15

| sel=15 | 15 | 14 | 13 | 12 | 11 | 10 | 9 | 8 | 7 | 6 | 5 | 4 | 3 | 2 | 1 | 0 |

Fig. 17 buffer contents

Fig. 20 buffer contents

Fig. 23 buffer contents

| sel=0 | 14 | 13 | 12 | 11 | 10 | 9 | 8 | 7 | 6 | 5 | 4 | 3 | 2 | 1 | 0 | 15 |

Fig. 19

| 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 1 |

Fig. 21

| sel=0 | 14 | 13 | 12 | 11 | 10 | 9 | 8 | 7 | 6 | 5 | 4 | 3 | 2 | 1 | 0 | 15 |

Fig. 22

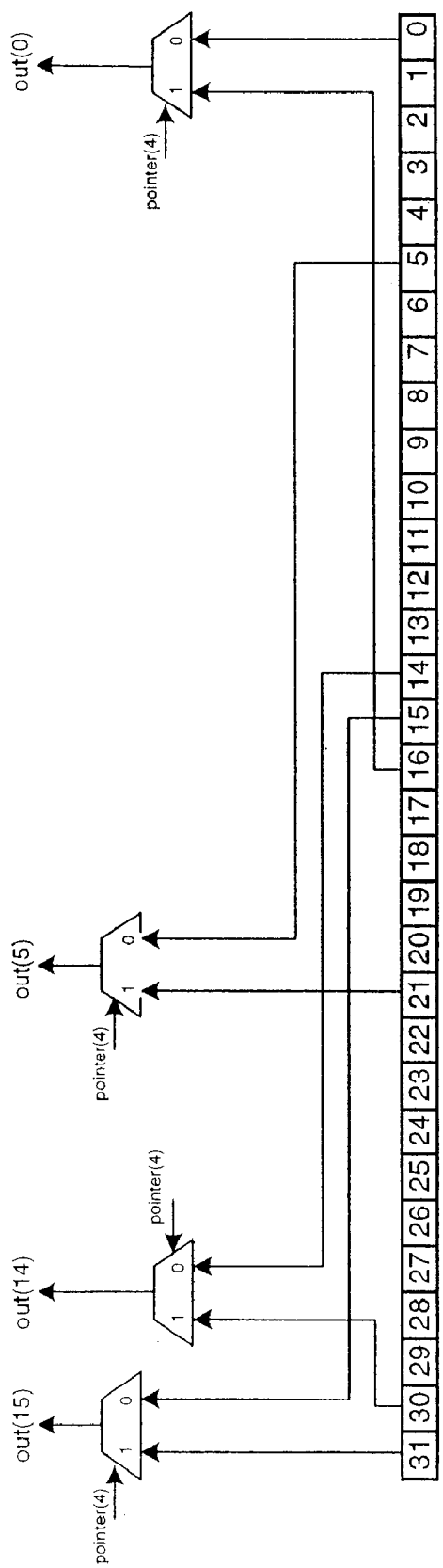
Fig. 24 writing out of the buffer

VARIABLE LENGTH CODING PACKING ARCHITECTURE

BACKGROUND

This disclosure is related to an architecture for packing variable length binary codes.

Entropy encoding is usually an integrated part of nearly all the image/video/text/data compression processes and International standards. Most image and video compression standards, including, for example, JPEG (Joint Photographic Experts Group) for still continuous tone image compression standard [ISO/IEC JTC1/SC29 IS 10918], JBIG (Joint Bi-Level Image Experts Group) for bi-level image compression standard [ISO/IEC JTC1/SC2/WG9, CD 11544], CCITT Group 3 and, Group 4 for facsimile standard [Hunter, et. al, International Digital Facsimile Coding, Standards, Proceedings of the IEEE, Vol. 68, No. 7, July 1980, pp. 854–867], ITU-T H.2.6x (e.g., H.261, H.163, H.263+) for video coding standards for video teleconferencing and MPEG (Moving Picture Experts Group) family, (e.g. MPEG1 [ISO/IEC JTC1/SC29 IS 11172], MPEG2 [ISO/IEC JTC1/SC29 IS 13818], MPEG4 [ISO/IEC JTC1/SC29/WG11 N1238]) for video compression standard suitable for storage, etc. as well as other text/data compression processes, such as gzip, pkzip, UNIX-compress, etc. employ variable length coding (VLC), such as Huffman coding, for example.

As is well-known, in VLC encoding, the encoder maps the input source data into binary code words of variable length. A hardware device to make the process of producing and/or outputting these code words convenient or easy to implement is desirable.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference of the following detailed description when read with the accompanying drawings in which:

FIGS. 1 to 7 illustrate an example of bit packing a buffer;

FIGS. 9 to 23 illustrate the example of FIGS. 1 to 7 in greater detail; and

FIG. 24 illustrates an aspect of the embodiment of FIG. 8 in greater detail;

DETAILED DESCRIPTION

Figure 8:
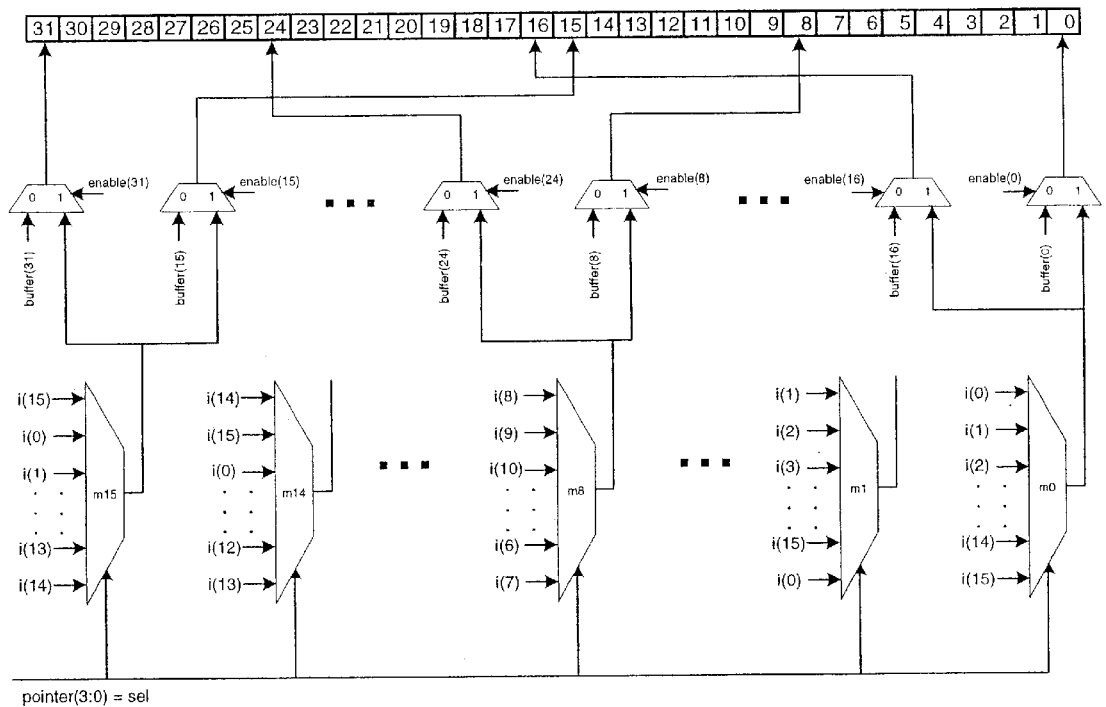
FIG. 8 illustrates an embodiment of a variable length bit packer.

In the following detailed description, numerous specific details are set forth in order to provide a thorough understanding of the claimed subject matter. However, it will be understood by those skilled in the art that the claimed subject matter may be practiced without these specific details. In other instances, well-known methods, procedures, components and circuits have not been described in detail in order so as not to obscure the claimed subject matter.

As described in more detail hereinafter, an embodiment of an efficient, unified, very large scale integration (VLSI) architecture for variable length bit packing, that is suitable for different compression processes and standards, is disclosed. It is, of course, understood that the claimed subject matter is not limited in scope to this embodiment and that this particular embodiment is merely intended to provide one possible implementation in accordance with the claimed subject matter. For example, in a system architecture with multiple compression standards, this embodiment may, for example, be multiplexed or interfaced with different other modules to comply with or provide compatibility with differing compression standards. This shall be discussed in greater detail hereinafter.

For example, a circuit configuration to pack selected portions of separate bit strings, the selected portions having varying length, into a single bit string of a predetermined length, may provide the capability to implement variable bit rate coding for the following compression standards: CCITT Group 3, Group 4, JPEG, MPEGx, H.26x, or other text/data compression standards, for example. Embodiments to accomplish this are described hereinafter. For convenience, this circuit configuration is referred to here as a variable length bit packer.

To provide some examples, although, of course, the claimed subject matter is not limited in scope in this respect, image compression standards, such as CCITT Group 3, Group 4, and JPEG, employ variable length bit packing of up to sixteen bits at a time. In CCITT Group 3 and Group 4 compression, for example, the bits to be packed may include mode code words, terminating code words, Huffman like make-up code words, actual bit values and markers. See, for example, Hunter et al., International Digital Facsimile Coding Standards, Processings of the IEEE, Vol. 68, No. 7, July 1980, pp854–867. In CCITT Group 3 and Group 4 decompression, the packed bits may be decompressed into bi-level picture elements, which may employ variable length packing for high performance as well. In baseline JPEG, the bits to be packed may include some form of the pixel magnitudes, Huffman code words, markers, bit padding and zero byte stuffing. Similar bit packing occurs in video and text coding processes as well.

This particular embodiment, described in more detail hereinafter, has the ability to bit pack anywhere from one to sixteen bits in one clock cycle. Furthermore, this particular embodiment may easily be scaled up to allow the packing of more than sixteen bits at a time or scaled down. However, the claimed subject matter is not limited in scope in these respects.

A variable length bit packer stitches together bit strings of different lengths. Once a predetermined number of bits have been stitched together, that chunk is ready to be transmitted further along in a system, for example, for additional or further processing. The bit packing may occur in big endian, little endian, or some hybrid format depending on the application, e.g., CCITT Group 3 and Group 4, GZIP, JPEG, MPEG, etc. The following example illustrates bit packing functionality that may be implemented in this particular embodiment.

In the embodiment described in connection with Example 1 below, the variable length bit packer comprises a 32 bit buffer, into which up to 16 bits may be packed at a time. Also, the packing in this embodiment occurs from left to right with the most significant bit on the left. However, this architecture is scaleable in both directions and can easily support bit packing from the right as well.

EXAMPLE 1

The buffer pointer starts at the left of buffer 110 in FIG. 1 because this example packs from left to right. The most significant bit is on the left. The input signals to the bit packer includes the sixteen bit input stream (designated 'input' below) and the number of bits to pack (designated 'length' below). The pointer start value in this example is 31 (IF in hexadecimal) and decrements down to 00 hexadecimal on the right where, in this particular embodiment, it then wraps around from 00h to 1Fh. The pointer decrements by the value of length.

Input=0000000000000100 length=3                   1)

pointer(4:0)=1Fh–03h=1Ch=28 decimal

FIG. 2 illustrates the contents buffer 110 after bit packing code '100'.

Input=0000001110010011 length=11                2)

pointer(4:0)=1Ch–0Bh=11h=17 decimal

FIG. 3 illustrates the contents of buffer 110 after then bit packing the input indicated above.

Input=0000000000000001 length=2                 3)

pointer(4:0)=11h–02h=0Fh=15 decimal

FIG. 4 illustrates the contents of buffer 110 after then bit packing the input indicated above.

In this embodiment, as shown in FIG. 4, the pointer crosses the sixteen bit boundary, putting it in the lower sixteen bits of the buffer. This crossing of the boundary, in this embodiment, may then trigger a valid indication or signal for the upper sixteen bits. Transitions of the upper bit of the pointer, bit 4 in this particular embodiment, signifies valid data to be output. In this case, the bit transitions from 1 to 0, although, of course, the claimed subject matter is not limited in scope in this respect.

Input=0111110001000100 length=15               4)

pointer(4:0)=0Fh–0Fh=00h=0 decimal

FIG. 5 illustrates the contents of buffer 110 after then bit packing the input indicated above.

Input=0011111111111100 length=16               5)

pointer(4:0)=00h–10h=10h=16 decimal

As illustrated in FIG. 6, after applying the input above to buffer 110, the first bit '0' of the code '0011111111111100' results in the pointer crossing another sixteen bit boundary. The other fifteen bits '011111111111100' are stored into the first most significant bit positions of the buffer. The buffer pointer(4:0) is now pointed to bit position 10h (decimal 16) to indicate that the next incoming code word packing starts from this location. Pointer(4) transitions from 0 to 1, signaling valid for the lower sixteen bits in the buffer. Now the lower sixteen bits from the buffer are output.

In this embodiment, the starting pointer value depends at least in part on the format. If packing in big endian format, for example, the index value starts at the most significant bit location of the buffer. In this case, the pointer starts at 31 or 1F hex, as shown in the example. For this embodiment, as explained in more detail hereinafter, the bottom four bits of the pointer may be used as the select signals for multiplexers (MUXs) employed to facilitate bit packing.

As demonstrated by the previous example, this embodiment for implementation of a variable length bit packer reduces or eliminates shifting, as is commonly used for bit packing, thus potentially reducing the number of gates employed for control circuitry. Of course, the claimed subject matter is not limited in scope in this respect, but in some embodiments, this may provide advantageous. Likewise, as previously indicated, this embodiment also allows the pointer and, thus, the packing to wrap around the buffer during a write, which enables the buffer to accept variable length data on every clock cycle. The wrapping pointer also allows the data to be written out every clock cycle. As explained in more detail hereinafter, this architecture also exhibits MUX symmetry, which may again be exploited to potentially reduce the gate count, although, again, the claimed subject matter is not limited in scope in this respect.

FIG. 7 shows a block diagram of an embodiment 700 of a variable length bit packer, although, of course, this is just an example. In this example, the vlc (variable length code) is the input data to be packed. Here, the length is the number of vlc bits to be packed. A vlc length greater than zero will make the value of pointer' in FIG. 7 different than pointer and, thus, trigger the rest of the chain to pack the specified number of input bits, vlc, here, (length—1:0). The new pointer value, pointer', tells MUX Chain 710 how to order the bits. MUX Chain 720 then feeds the buffer with the reordered vlc bits or re-circulates the current data depending, at least in part, on the enable bits, in this embodiment.

In this embodiment, the enable bits create a sixteen-bit moving window that reduces the risk of writing over good data, as illustrated below. The enable bits, for example, may, in this embodiment, be created by a circuit based at least in part on the previous pointer value, pointer(4:0). Referring, for example, to example 1, for (2) above, shown in FIG. 3, enable(31:0) is: 00011111111111111110000000000000. In this example, the most significant three bits contain good data, so enable(31:29)=000. In this particular embodiment, the enable bits are used to provide the select signal for 2 to 1 multiplexers in MUX Chain 720. Of course, again, this is just an example implementation and the claimed subject matter is not limited in scope to this implementation. In this implementation, as shown in FIG. 8, for example, an enable bit of zero does not allow a write to that buffer location. Thus, for this embodiment, sixteen trailing zeros will reduce and perhaps prevent the risk of overwriting good data before it has been output.

The sixteen bit output signal, data_out(15:0), is the contents of either the upper or lower half of the buffer. The most significant bit of the pointer, pointer(4), determines which half of the buffer is output, again, in this embodiment. Therefore, for this embodiment, if pointer(4) is a zero, the upper half of the buffer was updated last. Therefore, the upper half will be output.

The output signal, data_out(15:0), is valid when data_valid, shown in FIG. 7, goes high. Data_valid goes high, in this embodiment, for one clock cycle when the pointer crosses a sixteen bit boundary. In (3) of example 1, above, illustrated in FIG. 4, shows a case where the pointer crosses a boundary and the upper sixteen bits are valid.

Figure 26:
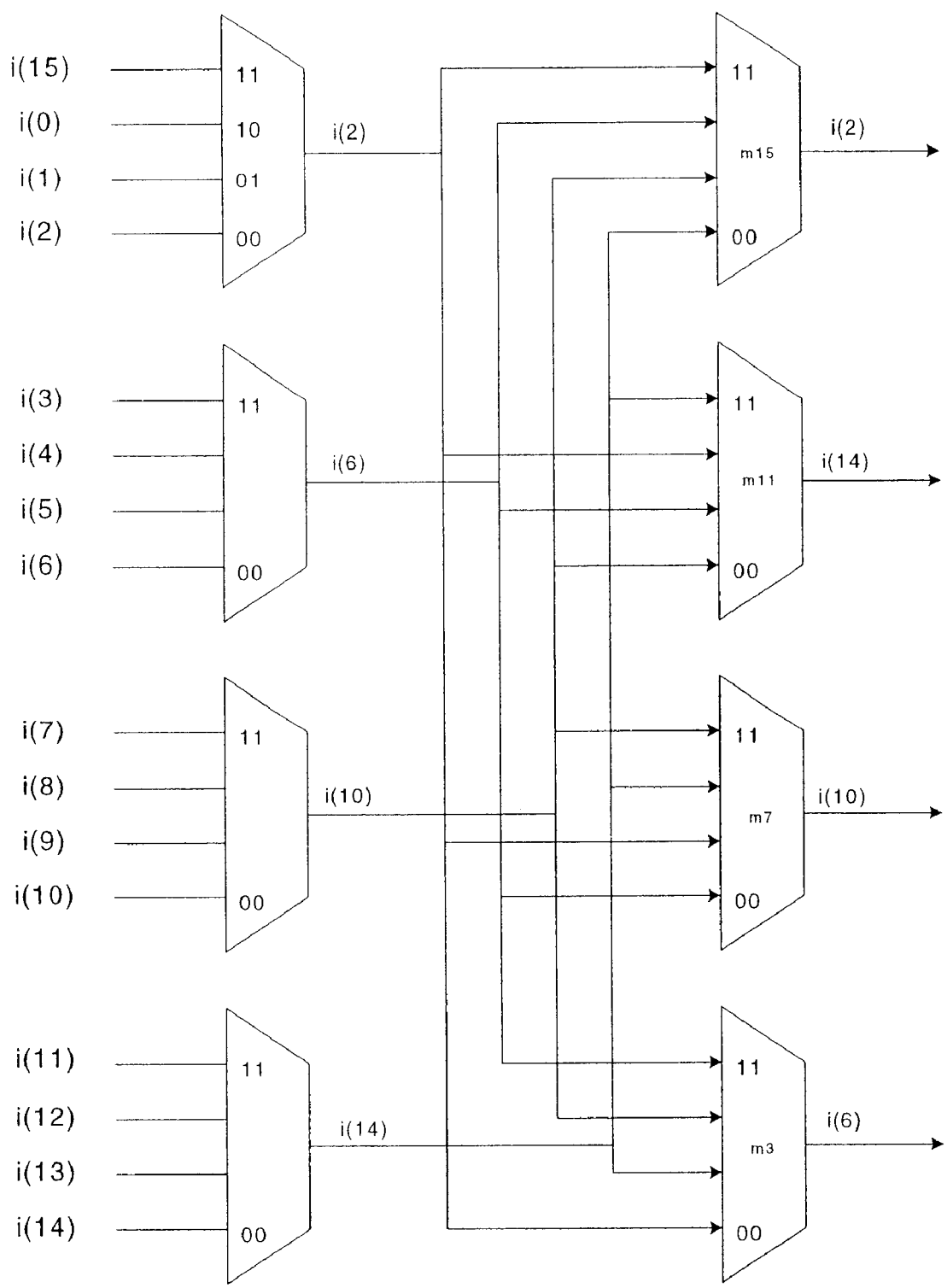
FIG. 26 illustrates another implementation of four 16×1 MUXes.

The details of this particular embodiment are explained in more detail below. FIG. 8 illustrates the operation of multiplexers employed to organize the data and write to the buffer. FIG. 24 illustrates writing the data out of the buffer. FIG. 26 illustrates employing MUX symmetry in this particular embodiment.

The bottom of FIG. 8 shows that data is fed to MUX Chain 710. The input signals labeled i(n) are the n bits of the sixteen bit input signal or vlc, in this particular example. For example, i(15), which is the most significant bit of the input signal, is fed to selector location 15 of mux 15, m15, and selector location 14 of m14, etc. FIG. 8 shows five multiplexers from MUX Chain 710 due to the space constraint of the diagram; more MUXes are, of course, employed in this particular embodiment. However, Table 1, below, shows the input signals to all sixteen multiplexers and their output signals given any pointer value, sel. Multiplexers m15, m14, m8, m1, and m0 in FIG. 8 correspond to columns in Table 1.

TABLE 1

| | m15 | M14 | m13 | m12 | m11 | m10 | m9 | m8 | m7 | m6 | m5 | m4 | m3 | m2 | m1 | m0 |
|---|---|---|---|---|---|---|---|---|---|---|---|---|---|---|---|---|
| sel = 15 | 15 | 14 | 13 | 12 | 11 | 10 | 9 | 8 | 7 | 6 | 5 | 4 | 3 | 2 | 1 | 0 |
| sel = 14 | 0 | 15 | 14 | 13 | 12 | 11 | 10 | 9 | 8 | 7 | 6 | 5 | 4 | 3 | 2 | 1 |
| sel = 13 | 1 | 0 | 15 | 14 | 13 | 12 | 11 | 10 | 9 | 8 | 7 | 6 | 5 | 4 | 3 | 2 |
| sel = 12 | 2 | 1 | 0 | 15 | 14 | 13 | 12 | 11 | 10 | 9 | 8 | 7 | 6 | 5 | 4 | 3 |
| sel = 11 | 3 | 2 | 1 | 0 | 15 | 14 | 13 | 12 | 11 | 10 | 9 | 8 | 7 | 6 | 5 | 4 |
| sel = 10 | 4 | 3 | 2 | 1 | 0 | 15 | 14 | 13 | 12 | 11 | 10 | 9 | 8 | 7 | 6 | 5 |
| sel = 9 | 5 | 4 | 3 | 2 | 1 | 0 | 15 | 14 | 13 | 12 | 11 | 10 | 9 | 8 | 7 | 6 |
| sel = 8 | 6 | 5 | 4 | 3 | 2 | 1 | 0 | 15 | 14 | 13 | 12 | 11 | 10 | 9 | 8 | 7 |
| sel = 7 | 7 | 6 | 5 | 4 | 3 | 2 | 1 | 0 | 15 | 14 | 13 | 12 | 11 | 10 | 9 | 8 |
| sel = 6 | 8 | 7 | 6 | 5 | 4 | 3 | 2 | 1 | 0 | 15 | 14 | 13 | 12 | 11 | 10 | 9 |
| sel = 5 | 9 | 8 | 7 | 6 | 5 | 4 | 3 | 2 | 1 | 0 | 15 | 14 | 13 | 12 | 11 | 10 |
| sel = 4 | 10 | 9 | 8 | 7 | 6 | 5 | 4 | 3 | 2 | 1 | 0 | 15 | 14 | 13 | 12 | 11 |
| sel = 3 | 11 | 10 | 9 | 8 | 7 | 6 | 5 | 4 | 3 | 2 | 1 | 0 | 15 | 14 | 13 | 12 |
| sel = 2 | 12 | 11 | 10 | 9 | 8 | 7 | 6 | 5 | 4 | 3 | 2 | 1 | 0 | 15 | 14 | 13 |
| sel = 1 | 13 | 12 | 11 | 10 | 9 | 8 | 7 | 6 | 5 | 4 | 3 | 2 | 1 | 0 | 15 | 14 |
| sel = 0 | 14 | 13 | 12 | 11 | 10 | 9 | 8 | 7 | 6 | 5 | 4 | 3 | 2 | 1 | 0 | 15 |

In this example, organizing the data via MUXes may be implemented by coupling or connecting from an input bit to the given selector position of a MUX in the order shown in Table 1. Thus, no logic is necessarily employed in this embodiment between the input data and the sixteen to one multiplexers, although, of course, the claimed subject matter is not limited in scope in this respect. Table 1 shows that for pointer=sel=12, the output signal of MUX Chain 710 is vlc(2:0, 15:3).

FIG. 8 shows the one bit output signals of the 16 to 1 MUXes are tied to bits n and n+16 in the 32 bit buffer. For example, the output signal of mux 15 (m15) is applied to bit locations fifteen and thirty one in the buffer. FIG. 8 shows m15 feeding buffer locations 15 and 31 via MUXes 830 and 840. As shown, the output signal of the MUXes are controlled, at least in part, by the corresponding bit of the enable mask. The enable signal for buffer location 31, enable (31), enables m15 to write to bit location 31 of the buffer. The enable mask allows 16 bits to be written into the 32 bit buffer at a time. In the example shown in FIG. 8, either bit 31 or bit 15 will be enabled depending, at least in part, on the value of the buffer pointer.

In one embodiment, the circuit to create the enable signals or enable mask comprises combinational logic, which creates a 32 bit mask depending, at least in part, on the value of the buffer pointer. Of course, again, the claimed subject matter is not limited in scope in this respect. The mask becomes all zeros when the incoming length is zero. This ensures, in this embodiment, that writes into the buffer occur when there is a length and input data present to be packed. The enable mask for the sixteen trailing buffer locations from pointer(4:0) is not asserted. If pointer(4:0)=24, then the enable mask for buffer locations 25–31 and 0–8 is zero, the rest are ones. Allowing a MUX to write to one of two buffer locations in this embodiment saves sixteen MUXes.

In another embodiment, the circuit to generate the enable signal may be simplified further by adding "don't cares" instead of zeros to the locations where bad data would be written over bad data. For example, if the pointer is at location 30, then buffer(15:0) has already been output and is stale data, so, the bit to be protected is bit buffer(31). The enable bits could be: 01111111111111111111111111111111. If pointer=8,then buffer(31:16) has already been output and is stale data, so, buffer(15:9) is to be protected. The enable bits could be: 11111111111111110000000111111111. This implementation may result in a smaller circuit but may, in some circumstances, potentially produce more switching than the previously described approach. Again, the claimed subject matter is not limited to any particular implementation, including either of these.

The following example is provided to illustrate this particular embodiment, although, again, the claimed subject matter is not limited in scope to the following example or implementation.

EXAMPLE 2

This example uses the input and length data from example 1, explained earlier.

Input=0000000000000100 length=3    1)

pointer'(3:0)=pointer(3:0)−length(3:0)=Fh−3h=C hex=12 decimal

As previously described, pointer'(3:0) is used as the "sel" value for the MUX Chain 710. The output signals of MUX Chain 710 are vlc input signals, re-ordered as shown in FIG. 9.

Figure 9:
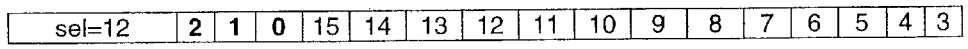
Figure 10:
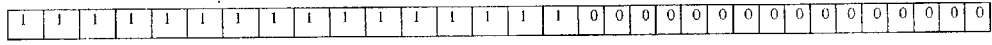

FIG. 9 illustrates re-ordered vlc bits out of MUX Chain 710 for pointer'(3:0)=sel=12. The bits of the re-ordered vlc out of MUX Chain 710 is then written into the upper or lower half of the buffer, depending on the enable bits. The enable bits, enable(31:0) here, are based at least in part on the previous pointer value, pointer. Since this is the first write into the buffer, pointer (3:0)=31 and enable(31:16) are ones, enable(15:0) are zeros. This is illustrated in FIG. 10.

For the input signal above, input bit 2 is a 1 and the rest of the bits are 0. The enable bits will allow buffer locations 31 to 16 to be written. Buffer (31:16) is written and buffer (15:0) is re-circulated. The shaded portion of the buffer in FIG. 11 is stale data or don't cares.

After the bits are clocked into the buffer, the enable bus is updated to mask out writes to buffer locations 31, 30, and 29, which now hold valid data, and 12 down to 0 where there could have been valid data if the current vlc to be bit packed had wrapped around from the lower half of the buffer and been up to sixteen bits long. The enable bit values are shown in FIG. 12. The write enabled buffer locations are represented by ones.

Input=0000001110010011 length=11 (2)

pointer'(3:0)=Ch–Bh=1 hex=1 decimal

Re-ordered vlc bit locations for pointer' (3:0)=sel=1 is illustrated in FIG. 13. As previously shown in FIG. 12, the enable bits mask writes to buffer locations 31, 30, and 29, to protect the previously written valid data. Buffer locations 28-14 are written with vlc bits 10-0 and, 15-11 as shown in FIG. 14. The shaded area represents don't cares.

After the bits are clocked into the buffer, the enable bus is updated to mask out writes to buffer locations 31:18, which now hold valid data from (1) and (2) above. The enable bits are shown in FIG. 15.

Input=0000000000000001 length=2 (3)

pointer'(3:0)=1h–2h=Fh=15 decimal

FIGS. 16 and 17 show the re-ordered vlc bits and contents of the buffer for (3) above. Pointer' (4) transitions from a one to a zero, thus triggering the valid signal for buffer(31:16). The enable bits are updated, shown in FIG. 18, to prevent writing over buffer(31:16) during implementation of (4).

Input=0111110001000100 length=15 (4)

pointer'(3:0)=Fh–Fh=0h=0 decimal

FIGS. 19 and 20 show the vlc bits reordered and the buffer contents for (4). Buffer (31:16) is now a don't care because the valid contents were previously output. Thus, the enable bit values shown in FIG. 21 allow writes to buffer locations 0 and 31:17. Buffer (16) contains stale data as well, however, in this embodiment, up to sixteen bits are written at a time, so the enable logic is simplified here by maintaining a sixteen bit window. Of course, the claimed subject matter is not limited in scope in this respect.

Input=0011111111111100 length=16 (5)

pointer'(3:0)=0h–0h=0h=0 decimal

FIGS. 22 and 23 show the vlc bits re-ordered and the buffer contents for (5). Pointer' (4) transitions from a zero to a one, thus triggering the valid signal for buffer (15:0). The packing continues in this fashion.

Another issue in this particular embodiment involves writing from the buffer. This particular example assumes a 16 bit output bus, although, of course, the claimed subject matter is not limited in scope on this respect. FIG. 24 shows the output signals of the 32 bit buffer are determined by the upper bit of the pointer, in this embodiment. If the pointer is in the bottom sixteen bits of the buffer, bit 4 of the pointer equals 0, then the top sixteen bits are enabled as the output signal. If the pointer is in the top 16 bits of the buffer, bit 4 of the pointer equals 1, then the bottom sixteen bits are enabled for output. As previously indicated, for this particular embodiment, the data out valid bit is generated when a sixteen bit boundary is crossed, which in this embodiment is signaled or indicated by pointer bit 4 changing state. This may be detected, for example, by an XOR operation applied to bit (4) with a one clock cycle delayed version of bit(4). Of course, this may be implemented with a variety of approaches and the claimed subject matter is not limited in scope to this particular suggested approach.

The symmetry of the multiplexers may also provide an opportunity to reduce hardware in this embodiment, as previously suggested. Typically, sixteen MUXes that perform a 16 to 1 selection operation may be implemented using 80 MUXes that perform a 4 to 1 selection operation. However, the symmetry of this architecture for this particular embodiment reduces this to 32 MUXes that perform the 4 to 1 selection. The reduction is made possible, for this embodiment, by the sequential nature of the input data. The MUXes receive the input signals, but in a different order.

Figure 25:
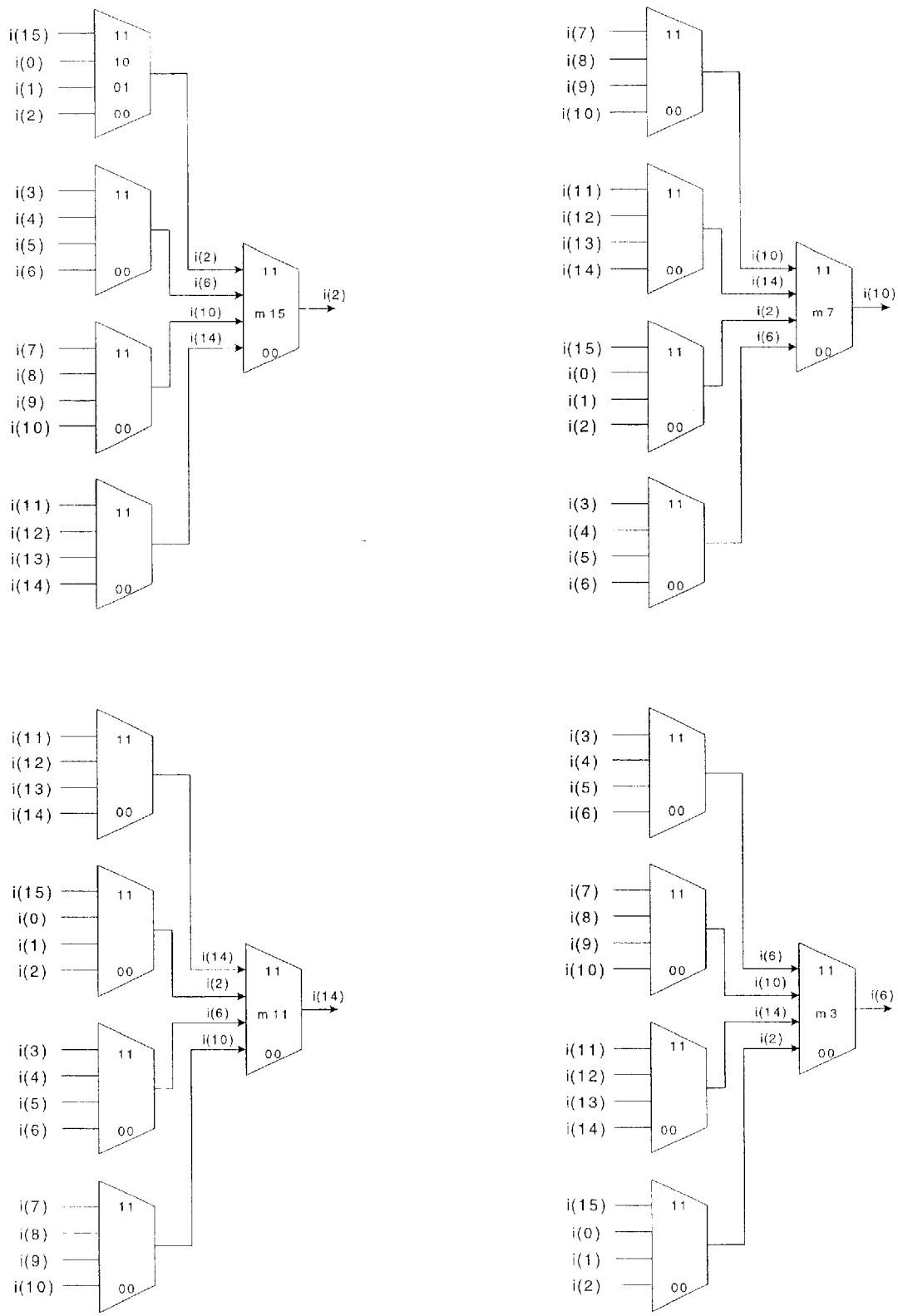
FIG. 25 illustrates one implementation of four 16×1 MUXes.

FIG. 25 shows the conventional implementation of 4 MUXes having 16 to 1 selection capability using 4 to 1 MUXes. Referring now to Table 1, and the row for sel=12, inspection now reveals that the output signals of the MUXes in FIG. 25, m15, m11, m7, and m3, match the vlc bits shown in FIG. 9 for sel=1100 (binary). Table 1 and FIG. 25 match for any sel value for this particular embodiment.

However, FIG. 26 shows an approach to implementing the 4, 16 to 1 MUXes using 4 to 1 MUXes. M15, m11, m7, and m3, for this embodiment, are created from one set or configuration of MUXes, thus reducing the MUX count from the 20, shown in FIG. 25, to the 8 shown in FIG. 26. This mux sharing implementation may also be employed, for example, for the remaining three sets of MUXes employed to implement this embodiment of the variable length bit packer. FIG. 26 uses the example illustrated in FIG. 25, sel=1100 (binary). Of course, again, this is just one example, and the claimed subject matter is not limited in scope to this particular example or implementation.

As indicated previously, an embodiment of a variable length bit packer in accordance with the claimed subject matter is not limited in scope to employing this symmetry. However, although the claimed subject matter is not limited in scope to the previously described embodiments, it has been demonstrated that a lower gate count may potentially be achieved compared to the traditional approach. Likewise, at least some embodiments may include the capability to pack a bit string of a predetermined length on every clock and write it out on every clock cycle. Likewise, for at least some embodiments, the capability to scale this length up or down in size, as desired, may be a feature. Furthermore, embodiments may alternatively support little endian format or big endian format, as desired, and may be employed, for example, to support variable length coding for JPEG, CCITT Group 3 and Group 4, MPEG, GZIP, etc. Of course, the claimed subject matter is not restricted in scope to employing or implementing only these compression approaches. Likewise, at least some embodiments may have multiple purposes, as desired.

Furthermore, an embodiment of a variable length bit rate packer may be used to implement a method of packing selected portions of separate bit strings into a buffer in accordance with the claimed subject matter. For example, although the claimed subject matter is not limited in scope in this respect, MUXes, such as 720 illustrated in FIGS. 7 and 8, may be employed to select the desired portions of the separate bit strings to be packed in the buffer. Likewise, MUXes, such as 710, may be employed to order the bits of the selected portions for packing in particular buffer locations. In such an embodiment, the MUXes to order the bits for packing may be controlled at least in part by a buffer location pointer that tracks the valid contents of the buffer, such as pointer(3:0), although, again, the claimed subject matter is not limited in scope in this respect. Likewise, the MUXes to select the desired portions to be packed may be controlled at least in part by a set of masking bits, such as the enable bits previously described.

It will, of course, be understood that, although particular embodiments have just been described, the claimed subject matter is not limited in scope to a particular embodiment or implementation. For example, one embodiment may be in hardware, whereas another embodiment may be in firmware, or any combination of hardware, and firmware, for example. Likewise, some embodiments may include software as part of the implementation as well. Further, a computer system or platform, such as a data compression system, for example, may result in an embodiment of a method in accordance with the claimed subject matter being executed, such as an embodiment of a method of packing selected portions of separate bit strings into a buffer, for example, as previously described.

While certain features of the claimed subject matter have been illustrated and described herein, many modifications, substitutions, changes and equivalents will now occur to those skilled in the art. It is, therefore, to be understood that the appended claims are intended to cover all such modifications and changes as fall within the true spirit of the claimed subject matter.

What is claimed is:

1. An integrated circuit comprising;
    a circuit configuration to pack selected portions of separate bit strings, at least some of the selected portions having varying length, into a single bit string of a predetermined length.

2. The integrated circuit of claim 1, wherein the circuit configuration includes the capability to wrap around between successive bit strings having the predetermined length.

3. The integrated circuit of claim 2, wherein the predetermined length is scalable.

4. The integrated circuit of claim 1, wherein the circuit configuration is capable of packing a single bit string of the predetermined length on every clock cycle.

5. The integrated circuit of claim 4, wherein the circuit configuration is capable of outputting a single bit string of the predetermined length on every clock cycle.

6. The integrated circuit of claim 1, wherein the circuit configuration is capable of implementing bit packing in big endian and little endian data formats.

7. An apparatus comprising:
    a computing platform to implement data compression;
    said platform including a variable length coding hardware architecture to pack selected portions of separate bit strings, the selected portions having varying length, into a single bit string of a predetermined length.

8. The apparatus of claim 7, wherein the architecture includes the capability to wrap around between successive bit strings having the predetermined length.

9. The apparatus of claim 7, wherein the predetermined length is scalable.

10. The apparatus of claim 9, wherein the architecture is capable of outputting a single bit string of the predetermined length on every clock cycle.

11. The apparatus of claim 7, wherein the architecture is capable of packing a single bit string of the predetermined length on every clock cycle.

12. A method of packing selected portions of separate bit strings into a buffer, said method comprising:
    using multiplexers (MUXes) to select the desired portions of the separate bit strings to be packed in the buffer; and
    using MUXes to order the bits of the selected portions for packing in particular buffer locations, wherein at least some of the selected portions have varying lengths.

13. The method of claim 12, wherein the MUXes to order the bits for packing are controlled at least in part by a buffer location pointer that tracks the valid contents of the buffer.

14. The method of claim 12 wherein the MUXes to select the desired portions to be packed are controlled at least in part by a set of masking bits.

15. The method of claim 12 wherein using MUXes to order the bits comprises sending a common selector signal to the ordering MUXes.

16. An apparatus comprising:
    a buffer;
    a plurality of masking multiplexers (MUXes); and
    a plurality of ordering MUXes;
    wherein said buffer and said MUXes are coupled so that selector signals applied to said MUXes order and pack portions of varying lengths of separate bit strings in said buffer.

17. The apparatus of claim 16, wherein the MUXes to order the bits for packing are coupled so as to be controlled at least in part by a buffer location pointer that tracks the valid contents of the buffer.

18. The apparatus of claim 16 wherein the MUXes to select the desired portions to be packed are coupled so as to be controlled at least in part by a set of masking bits.

19. The apparatus of claim 16 wherein the ordering MUXes are coupled as to be controlled by a common selector signal.

* * * * *